United States Patent [19]

Stengl et al.

[11] Patent Number: 5,742,062
[45] Date of Patent: Apr. 21, 1998

[54] ARRANGEMENT FOR MASKED BEAM LITHOGRAPHY BY MEANS OF ELECTRICALLY CHARGED PARTICLES

[75] Inventors: Gerhard Stengl, Wernberg; Alfred Chalupka, Vienna; Herbert Vonach, Klosterneuburg; Hans Loeschner, Vienna, all of Austria

[73] Assignee: IMS Mikrofabrikations Systeme GmbH, Vienna, Austria

[21] Appl. No.: 598,081

[22] Filed: Feb. 8, 1996

[30] Foreign Application Priority Data

Feb. 13, 1995 [AT] Austria ........................ 259/95

[51] Int. Cl.$^6$ ............................. H01J 37/10; H01J 37/30
[52] U.S. Cl. ........................ 250/396 R; 250/492.2
[58] Field of Search ..................... 250/396 R, 398, 250/492.2, 492.21, 292

[56] References Cited

U.S. PATENT DOCUMENTS

| | | | |
|---|---|---|---|
| 4,360,760 | 11/1982 | Brodowski | 250/396 R |
| 4,383,180 | 5/1983 | Turner | 250/398 |
| 4,560,905 | 12/1985 | Maschke | 250/396 R |
| 4,563,587 | 1/1986 | Ward et al. | 250/396 R |
| 4,757,208 | 7/1988 | McKenna et al. | 250/492.2 |
| 4,912,421 | 3/1990 | Anderson | 328/233 |
| 4,922,106 | 5/1990 | Berrian et al. | 250/398 |
| 4,967,088 | 10/1990 | Stengl et al. | 250/491.1 |
| 5,051,593 | 9/1991 | Ishihara | 250/396 R |
| 5,160,846 | 11/1992 | Ray | 250/492.2 |

FOREIGN PATENT DOCUMENTS

| | | |
|---|---|---|
| 344646 | 12/1989 | European Pat. Off. . |
| 325575 | 9/1994 | European Pat. Off. . |

OTHER PUBLICATIONS

J.J. Murray, "Characteristics and Applications of Multiple Beam Machines", Microelectronic Engineering 9 (1989) pp. 305–309 no month.

Kamil A. Valiev, "The Physics of Submicron Lithography", Microdevices, Physics and Fabrication Technologies, 1992, pp. 54–71 and 272–301 no month.

R. Speidel et al, "Lithium–ion–beam exposure of PMMA–layers without proximity–effect", Optik 54 (1979;80) No. 5, 430–444.

Dariusz Korzec, Kapazitiv Gekoppelte Hochfrequenz–Ionenquelle mit radialer Anordnung der Anregungselektroden fur reaktives Ionenstrahlatzen, Series 9, Electronik No. 160 no date.

Primary Examiner—Bruce Anderson
Attorney, Agent, or Firm—Cushman, Darby & Cushman IP Group of Pillsbury Madison & Sutro LLP

[57] ABSTRACT

An arrangement for masked beam lithography by means of electrically charged particles for the imaging of structures of a mask on a substrate arranged behind it, with a substantially punctiform particle source (Q) and an extraction system (Ex) for a specific type of charged particles which leave the source (Q) in the form of a divergent particle beam, and with an electrode arrangement (B, B', $El_1$, $El_2$, $E_3$, ... $El_n$) for concentrating the divergent particle beam into a particle beam which is at least approximately parallel, by means of which an electrostatic acceleration field (E) is generated, the potential (U) of which in the beam direction has a constant gradient at least in parts and perpendicular to the beam direction is substantially constant at least within the beam cross-section. The electrode arrangement can be formed for example by a plurality of coaxial ring electrodes ($El_1$, $El_2$, $El_3$, ... $El_n$) which are disposed at intervals behind one another in the beam direction, by a coaxial hollow cylinder which is aligned in the beam direction or a grating with a predetermined constant electrical resistance per unit of length, or by a plurality of longitudinal bars which are aligned in the beam direction, disposed parallel on surface of an imaginary coaxial cylinder with a predetermined constant electrical resistance per unit of length.

40 Claims, 3 Drawing Sheets

ARRANGEMENT FOR MASKED BEAM LITHOGRAPHY BY MEANS OF ELECTRICALLY CHARGED PARTICLES

FIELD OF THE INVENTION

The present invention relates to an arrangement for masked beam lithography by means of electrically charged particles for the imaging of structures of a mask on a substrate arranged behind it, with a substantially punctiform particle source and an extraction system for a specific type of charged particles which leave the source in the form of a divergent particle beam, and with a means for concentrating the divergent particle beam into a particle beam which is at least approximately parallel for irradiation of the mask or of the substrate.

DESCRIPTION OF THE KNOWN PRIOR ART

A lithography system of this type is disclosed for example in U.S. Pat. No. 4,757,208. A system for ion beam lithography by means of masked beam projection, usually called MIBL (=masked ion beam lithography) is described in this document. In this system a hydrogen ion source with an extraction system is provided, the latter having a magnetic sector field for mass filtering of the particles coming from the source. Behind the sector field in the beam direction there is located an electrostatic convergent lens which is composed of two coaxial tubes and which collects the particle beam in a so-called crossover to form an image point of the virtual source. This crossover lies in the front focal plane of a second convergent lens which is likewise composed of two coaxial tubes and which forms the above-mentioned means for concentrating the divergent particle beam into a parallel beam. A lithographic mask which is disposed immediately above a substrate is irradiated with this parallel beam so that direct imaging of the mask structures on this substrate is facilitated. A further system of this type is described in the periodical Optik, Volume 51, Issue 5, in an article entitled "Lithium-ion-beam exposure of PMMA-layers without proximity-effect" by R. Speidel and U. Behringer dating from 1979. Instead of lenses with two coaxial tubes, in this known system two singel lenses are provided which are each formed from three coaxial ring electrodes. The singel lens disposed on the mask side or on the wafer side forms the means for concentrating the divergent particle beam into a parallel beam.

The resolution which can be achieved by means of such a known system is dependent upon a number of factors, namely the energy distribution of the particles coming from the source and the virtual source size, that is to say the narrowest diameter of the area from which the particles of the source apparently originate. Furthermore, the quality of the imaging is limited by the aberration of the convergent lenses, in particular the second lens which is used for generating the parallel beam. If the particle beam is not exactly parallel, but slightly convergent or divergent, the inaccuracy of the distance between the mask and the substrate also becomes apparent as an imaging aberration. This is compounded by any unevenness of the substrate or of the mask.

OBJECT OF THE INVENTION

It is an object of the invention to improve an arrangement for masked beam lithography of the type mentioned in the introduction so that the imaging aberrations are reduced by comparison with the known systems, the image field for the imaging being enlarged by comparison with known devices.

Likewise, it is an object of the invention to create an arrangement which can be produced at comparatively low cost and which is additionally distinguished by its compactness.

SUBJECT MATTER OF THE INVENTION

The above-mentioned objects are achieved according to the invention in that the means for concentrating the particle beam has an electrode arrangement for generating an electrostatic acceleration field, the potential of which in the beam direction has a constant gradient at least in parts and perpendicular to the beam direction is substantially constant at least within the beam cross-section, so that the charged particles are guided on parallel paths and the divergent particle beam is substantially concentrated into a parallel beam. In an advantageous manner the homogeneous electrostatic field formed by the electrode arrangement does not result in any so-called lens aberrations which limit the resolution of the masked beam projection of known lithography systems, so that a considerable reduction in the total aberration of the imaging can be achieved in the lithography system according to the invention.

In an embodiment of the present invention which is advantageous in practice the electrode arrangement for generating the homogeneous electrostatic field has a plurality of coaxial ring electrodes which are disposed at intervals behind one another in the beam direction and are connected to different potentials in such a way that a homogeneous acceleration field is formed in the beam direction within the beam cross-section. In another embodiment the electrode arrangement for generating the homogeneous electrostatic field has a coaxial hollow cylinder which is aligned in the beam direction and has a predetermined electrical resistance per unit of length, the end surfaces of the hollow cylinder being connected to predetermined electric potentials. In a special embodiment the hollow cylinder can be constructed as a grating. In a further embodiment the electrode arrangement for generating the homogeneous electrostatic field has a plurality of longitudinal bars which are aligned in the beam direction, disposed on an imaginary surface of a coaxial cylinder about the longitudinal axis of the beam and has a constant resistance per unit of length, the end surfaces of these bars each being connected to a predetermined potential.

In an advantageous embodiment of the arrangement according to the invention there is provided in the beam path between the source and the electrode arrangement at least one electrostatic convergent lens which concentrates the divergent particle beam coming from the source into an image of the source which lies in or before the starting potential plane of the electrode arrangement. The punctiform source can for example be a punctiform electron source in the form of a field emission tip or an ion source with a virtual source point, which optionally has a separation means for separating off ions of a desired particle type (e.g. a Wien filter).

An advantageous electrode arrangement for a masked beam lithography system according to the invention has an inlet aperture electrode, the aperture of which contains the source point or the image of the punctiform source and is not substantially larger than the diameter of the virtual source or of the image of the virtual source, the aperture electrode being connected to a potential which corresponds to the energy of the charged particles in the source or at the image point of the source, the homogeneous electrostatic acceleration field directly adjoining this aperture electrode. In this case no lens aberrations appear at all, so that optimum resolution can be achieved. The imaging aberration is caused merely by the finite expansion and the energy distribution of the source. Deviations from the homogeneity of the electrical field only play a subordinate role as sources of aberration. In this case, the divergent particle beam is not concentrated exactly into a parallel beam, but depending upon the accelerating voltage is concentrated into a slightly divergent particle beam. As a result the mask is imaged slightly enlarged on the substrate. This can be taken into account in the production of the mask structures with a predetermined distance between the mask and the substrate.

As an alternative to this, an advantageous electrode arrangement for a masked beam lithography system according to the invention has an aperture electrode which is disposed in the beam direction at a distance from the source or from the image of the source and has an aperture substantially adapted to the diameter of the particle beam at this location, the aperture being connected to a potential which substantially corresponds to the energy of the charged particles in the source or at the image point. The inlet aperture of the shutter acts on the particle beam like a convergent lens, so that the concentration into a substantially parallel particle beam can take place, the homogeneous electrostatic acceleration field immediately adjoining this shutter. However, due to the lens effect of the aperture electrode slight lens aberrations are caused which slightly reduce the resolution of the shadow projection, but with the significant advantage that the system is less sensitive with regard to the distance between substrate and mask.

In a preferred embodiment of the lithography system according to the invention the homogeneous electrostatic field extends in the beam direction from the shutter as far as the substrate, the substrate being a terminal electrode of the electrode arrangement which is connected to the potential of the homogeneous electrostatic field at this location, and the mask is likewise an electrode of the electrode arrangement which is connected to the potential of the homogeneous electrostatic field at this location.

Furthermore, an arrangement of this type can be improved by making the field intensity of the homogeneous acceleration field variable within predetermined limits, so that the deviation of the particle beam from the parallelism in the region of the substrate is altered and the structures of the mask are imaged more or less enlarged on the substrate.

The arrangement according to the invention facilitates a high resolution, even with relatively large distances between the mask and the substrate, e.g. 1 mm. Therefore it is advantageous if the mask is disposed immediately before the substrate in the beam direction and the distance between the mask and the substrate is between 10 μm and 1 cm.

In an embodiment which is advantageous in practice, the means for concentrating the particle beam which were mentioned in the introduction also have a means for tilting the particle beam perpendicular to the beam direction and a means for altering the beam cross-section, which are disposed in the region of the homogeneous electrostatic field and connected to a potential which corresponds to the potential of the electrostatic field at this location. The means for tilting the particle beam can simply be a multipole which is operated as a dipole and is disposed coaxially about the axis of the particle beam, and which in the beam direction is formed by a plurality of portions disposed one after the other of which each as base potential is connected to the potential of the electrostatic acceleration field at the relevant location, the potentials for generating a dipole field being added to this base potential. The means for altering the beam cross-section can simply be a multipole which is operated as a quadrupole or as a hexapole and is disposed coaxially about the axis of the particle beam and which in the beam direction is formed by a plurality of portions disposed one after the other of which each as base potential is connected to the potential of the electrostatic acceleration field at the relevant location, the potentials for generating a quadrupole or hexapole field being added to this base potential. With such an arrangement it is possible in an advantageous manner for the means for displacing the particle beam or the means for altering the beam cross-section to be integrated into the electrode arrangement for generating the homogeneous acceleration field, this electrode arrangement being divided into a plurality of sectors which each form a pole of the multipole.

Further features and advantages of the invention are apparent from other claims and from the following description of individual embodiments of an arrangement according to the invention for masked beam lithography.

DETAILED DESCRIPTION OF THE INVENTION

Figure 1:
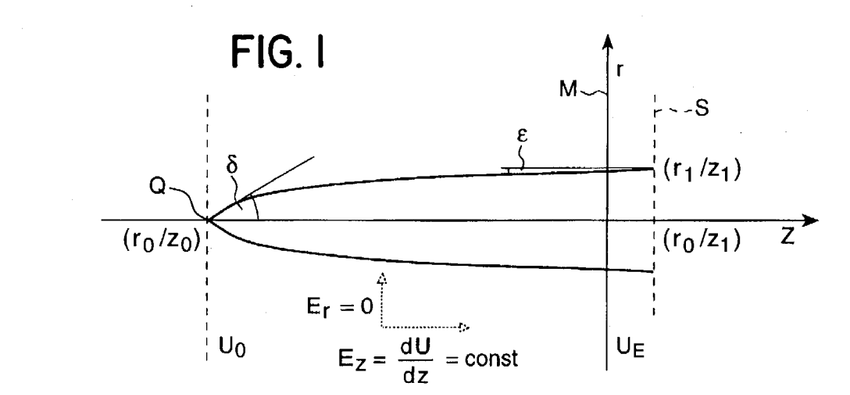
FIG. 1 shows a schematic representation of the concentration of a divergent particle beam in a homogeneous electrostatic field.

Reference is first of all made to FIG. 1 in which particle paths of a divergent particle beam are represented in a homogeneous electrostatic acceleration field. Q is a punctiform particle source, e.g. an ion or electron source, which is located in a cylindrical co-ordinate system with the axes r and z at the point $((r_0/z_0)$ and has a potential $U_0$. A potential $U_E$ is measured at a distance from the source Q at which for example a mask M is located. A substrate S is disposed immediately behind the mask M, e.g. in $z_1$. In the r-direction the potentials measured between $r_0$ and the maximum beam radius $r_1$ are constant, whereas in the z-direction there is a constant gradient, so that between the source Q and the mask M or the substrate S there is formed a homogeneous electrostatic field which is aligned in the z-direction, the field intensity $E_z$ thereof being constant in the z-direction and equal to zero in the r-direction. In this field $E_z$ the charged particles emitted from the source at a specific angle δ to the z-direction are accelerated on parabolic paths in the direction of the substrate S. Only the particles emitted parallel to the z-direction are accelerated in a straight line. The physical procedure is similar to an oblique throw downwards in the earth's gravitational field in a frictionless environment, in which the masses are likewise accelerated on parabolic paths in the direction of the surface of the earth.

For the trajectory of a charged particle in the homogeneous electrostatic field $E_z$ the following relation is produced:

$$z = \frac{r}{\delta} + \frac{1}{4} \cdot \frac{E_z}{U_o} \cdot \frac{1}{\delta^2} \cdot r^2,$$

where $\delta$ denotes the angle between the z-direction and the direction of the particle beam as it leaves the source or enters the homogeneous field ($0 \leq \delta \leq \delta_{max}$). The charge of the particle q is not included in the above relation, so that for example identical trajectories are to be expected for singly or doubly charged particles.

As can be seen from FIG. 1, a divergent particle beam can be concentrated by means of a homogeneous electrostatic field into an approximately parallel beam. The deviation $\epsilon$ of the marginal beams of the particle beam from the parallelism, that is to say the angle between the tangent to the trajectory of the particle and a straight line parallel to the z-direction, is essentially dependent upon the divergence $2\delta_{max}$ of the particle on entry into the homogeneous acceleration field, the field intensity $E_z$ of this electrostatic field and the distance between the source Q and the mask M or the substrate S.

Thus this approximately parallel beam can be used for imaging of structures on a mask by means of masked beam onto a substrate. At the location of the mask or of the substrate the beam thus formed, as already mentioned, always has a slight deviation from the parallel, since the parabolic particle paths always enclose an angle with the z-direction which, however, becomes smaller as z increases. However, the enlarging masked beam projection thus produced can be taken into consideration in a simple manner in the production of the structures of the mask for such imaging. In this case the distance between the mask and the substrate must also be taken into consideration. Since the angle $\epsilon$ is dependent upon the field intensity $E_z$, the enlargement of the mask structures can therefore be varied by an alteration of the field intensity within certain limits.

Since the lithography system functions in principle without electrostatic lenses, the resolution of the imaging is naturally also not impaired by lens aberrations. This means that the imaging aberration is determined only by the finite size of the source and the energy distribution of the particles leaving the source. On the other hand, aberrations resulting from inhomogeneities of the electrostatic field are insignificantly small, since for example there are no great technical problems involved in generating an electrostatic field where relative deviations from the homogeneity $\Delta E/E$ within the beam cross-section are below $10^{-5}$.

In order to keep the total imaging aberration as low as possible, therefore, within the scope of the invention it is essential as far as possible to use punctiform and monoenergetic particles sources, that is to say electron or ion sources with low expansion and unsharpness of energy. Suitable ion sources or electron sources of this type are known. Such sources are described in detail for example in a publication entitled "The Physics of Submicron Lithography" by K. A. Valiev, which appeared in Plenum Press, New York 1992, or in an article by Dipl-Ing. Doriusz Korzec entitled "Kapazitiv gekoppelte Hochfrequenz-Ionenquelle mit radialer Anordnung der Anregungselektroden für reaktives Ionenstrahlätzen", published in VDI Fortschritt Berichte, VDI-Verlag, Series 9, Electronik, No. 160. The nature and precise construction of the particle source will not be dealt with in greater detail below.

DETAILED DESCRIPTION OF PREFERRED EMBODIMENTS OF THE INVENTION

Figure 2:
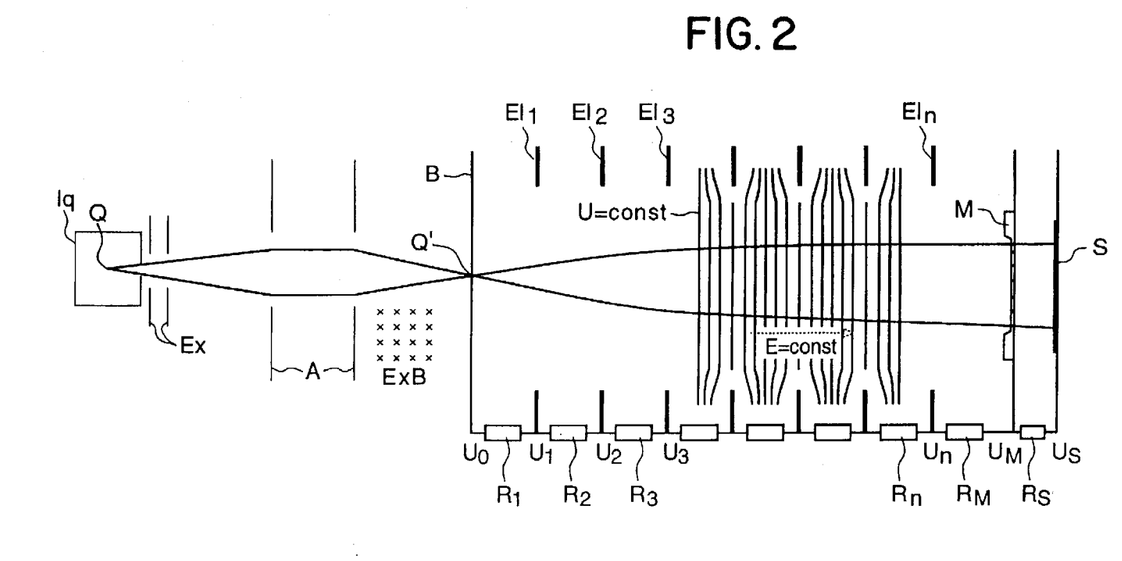
FIG. 2 shows an embodiment of an arrangement according to the invention.

FIG. 2 shows an embodiment of an arrangement according to the invention with an electrode system for producing a homogeneous acceleration field as was described with reference to FIG. 1. As particle source an ion source Iq with a virtual source point Q is provided, which has an extraction system Ex constructed in such a way that the ions of the emerging beam originate to the greatest possible extent from a punctiform area Q. The particle beam coming from the source Iq is imaged in a known manner, for example by an electrostatic convergent lens A, in an image point Q' (crossover), the energy $q \cdot U_0$ (q is the charge of a particle) of the particles at the location of the image point Q' corresponding substantially to the extraction energy, that is to say the energy with which the particles are extracted from the extraction system Ex of the particle source Iq.

In the illustrated case with an ion source Iq the imaging system A also has a separation means for separating off ions of a desired type, e.g. $H^+$ ions, from undesired ions, e.g. $H_2^+$ or $H_3^+$ ions. A Wien filter for example is used for this, in which an electrostatic dipole field and a homogeneous magnetic field are aligned at right angles to one another and both at right angles to the beam direction. For an electron source such a mass filter is not generally necessary.

As can be seen from FIG. 2, the image Q' of the source is surrounded by an aperture electrode B which is connected to the potential $U_0$ which results from the energy $q \cdot U_0$ of the particles at this image point (=potential of the crossover). In general the energy of the particles at this point amounts to between 2 and 20 keV. The aperture electrode B forms a first terminal electrode of the electrode arrangement for generating the homogeneous electrostatic field E which immediately adjoins the aperture B in the beam direction.

The portion of the electrode arrangement located behind the aperture electrode has a plurality of ring electrodes $El_1$, $El_2$, $El_3$, ..., $El_n$ disposed behind one another, these ring electrodes being disposed at substantially equal distances from one another and connected to predetermined potentials $U_1$, $U_2$, $U_3$, ..., $U_n$ which in the beam direction represent a linearly rising or falling function, so that a homogeneous electrostatic field E is formed within the cylindrical field space delimited by the ring electrodes $El_1$, $El_2$, $El_3$, ..., $El_n$. For this purpose the fine electrodes can be connected in series for example by way of perfectly similar preset resistors $R_1$, $R_2$, $R_3$, ..., $R_n$. In practice, however, the field E will only satisfy the strict requirements for homogeneity at a certain distance from the ring electrodes, so that the diameter of the ring electrodes is chosen to be approximately double the maximum beam diameter. Equipotential lines (U=const) which are constructed perpendicular to the beam direction between the ring electrodes of the electrode arrangement are illustrated schematically in FIG. 2 for a portion of the homogeneous electrostatic field E.

In the embodiment according to FIG. 2 the homogeneous electrostatic field E extends as far as the substrate S which in this case forms the second terminal electrode of the electrode arrangement and is connected to the potential $U_S$ which corresponds to the potential of the homogeneous electrostatic field E at this location. For this purpose the substrate S is connected in series with the last ring electrode $El_n$ by way of a resistor $R_S$.

A mask M is disposed immediately before the substrate S and is likewise connected to the potential $U_M$ of the electrostatic field E at this location in order to ensure a continuously homogeneous electrostatic field E between the aperture electrode B and the substrate S. However, it is a prerequisite for this that the mask M is sufficiently electrically conductive. For this purpose a mask can optionally be provided with a thin metal coating. In the illustrated embodiment the mask M is connected by way of a resistor $R_M$ in series with the last ring electrode $El_n$ and the resistor $R_S$.

Depending upon the application the potential $U_S$ differs between approximately 50 kV and 200 kV from the potential $U_0$ of the aperture electrode B. Thus with a length of the electrode arrangement of approximately 1 m to 2 m the field intensity of the homogeneous electrostatic field E amounts to between 25 kV/m and 200 kV/m.

In an alternative embodiment of the electrode arrangement, which is not illustrated here, instead of the ring electrodes there is disposed behind the aperture electrode B a hollow cylinder with a predetermined resistance per unit of length which is constant over the entire length of the hollow cylinder, the end surfaces of this hollow cylinder being connected to the potential $U_0$ of the aperture electrode B on the one hand or the potential $U_n$ on the other hand. A homogeneous electrostatic field E is likewise formed in the beam direction within the hollow cylinder. The substrate or the mask can again be integrated into the homogeneous electrostatic field in which they are for example connected in series with the hollow cylinder by way of corresponding resistors. Naturally the mask and the substrate can also be supplied with separate DC voltages independently of the hollow cylinder.

If one of the electrode arrangements described above is a sufficient conductor of heat it can be cooled at least in parts to a low temperature in order to facilitate the absorption of radiant heat and thus to facilitate a so-called radiant cooling in particular of the surfaces of the mask or substrate facing the interior. A device of this type is described in detail in European Patent No. EP-A-325 575 in the name of the present applicant.

In a further alternative embodiment which is not illustrated here the hollow cylinder can be in the form of a grating or can be formed by a plurality of similar longitudinal bars disposed parallel on the imaginary surface of a coaxial cylinder and having a constant resistance per unit of length.

Characteristic data for an achievable embodiment according to FIG. 2 are summarised below in Table 1.

Figure 3:
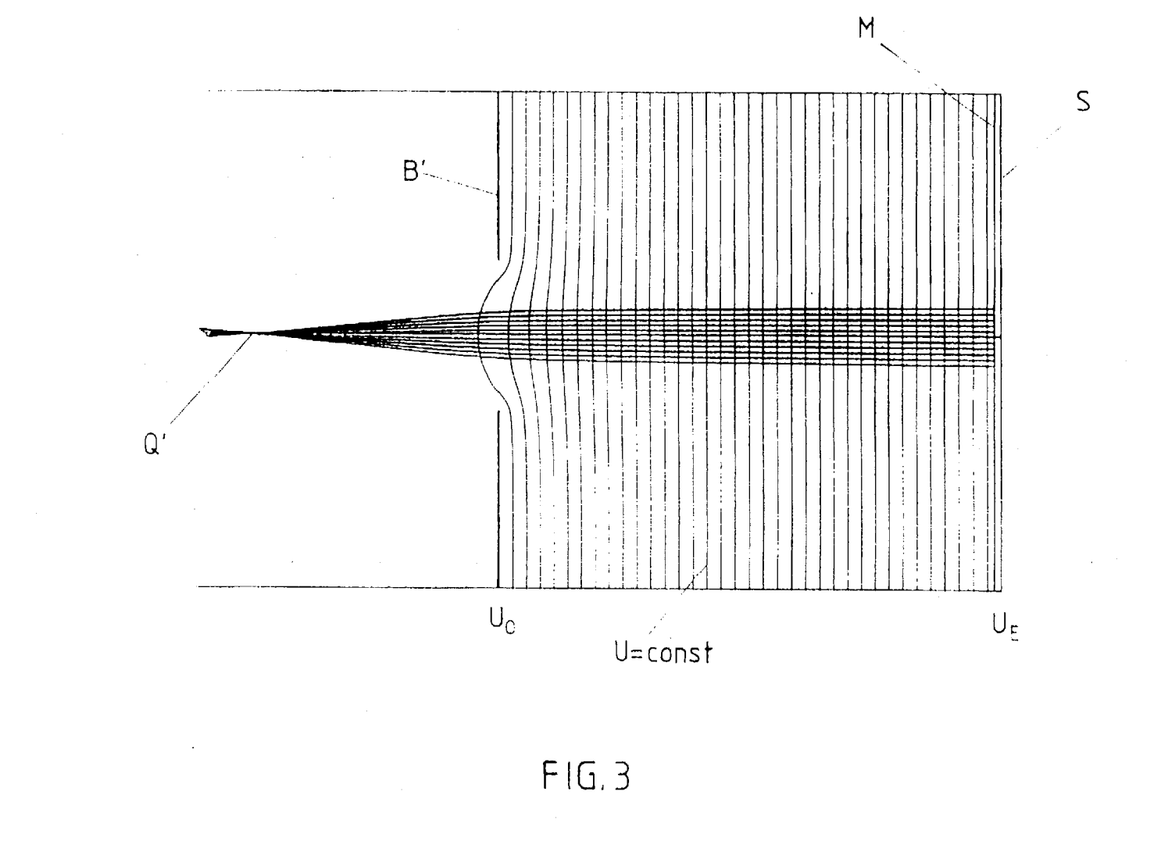
FIG. 3 shows a schematic representation of the concentration of a divergent particle beam in an arrangement according to the invention consisting of a field-free space and a homogeneous electrostatic field.

FIG. 3 shows schematically a further embodiment of an arrangement according to the invention in which the electrode arrangement has an inlet aperture electrode B' which is, however, disposed in the beam direction at a distance from the image Q' of the source or the virtual source point and is connected to a potential $U_0$ which corresponds to the energy $q \cdot U_0$ of the charged particles in the point Q or Q' of the source. Adjoining the aperture electrode B' is an electrode arrangement which is suitable for generating a homogeneous electrostatic field E which extends substantially as far as the substrate S. The concrete construction of the electrode arrangement is not shown in FIG. 3. It is possible to use for this inter alia ring electrodes according to FIG. 2, or a hollow cylinder or longitudinal bars with constant resistance per unit of length or the like.

At the aperture of B' the electrical field of the electrode arrangement enters the space between the image of the virtual source Q' or the virtual source point Q and the aperture electrode B' and thus forms a convergent lens which is used for a partial concentration of the divergent particle beam. The further concentration of the particle beam again takes place in the homogeneous electrostatic acceleration field E between the aperture electrode B' and the substrate S, and in fact takes place substantially on parabolic paths. Naturally, in this case also both the substrate and the mask, which is not shown, can be included in the homogeneous field in which the said parts are connected to corresponding potentials.

The effect of the aperture of B' as a convergent lens has the consequence that the divergent particle beam is more strongly concentrated, so that in the region of the mask or of the substrate the beam has a smaller deviation from the parallel by comparison with the earlier embodiment. Thus the quality of the imaging depends to a considerably lesser extent upon the precise maintenance of the distance between the mask and the substrate. Equally, in this case it is no longer absolutely essential to take the divergence of the particle beam into consideration in the production of the mask. On the other hand, however, due to the lens effect of the aperture electrode B' lens aberrations are produced which somewhat impair the quality of the masked beam projection of the mask structures onto the substrate with regard to distortion, that is to say they allow certain deviations of the image points from their desired positions. Characteristic data for an embodiment according to FIG. 3 are set out below in Table 2 with reference to a concrete numerical example.

The angle $\epsilon$ between the marginal beams and the z-axis principally depend in this embodiment upon the angle $\delta$ at which the marginal beam is emitted from the image of the virtual source, and upon the ratio of the ultimate energy of the particles to their initial energy. In fact the difference between the initial and ultimate angle $\delta-\epsilon$ increases approximately in proportion to $\sqrt{U_e/U_0}$ where $U_e$ is the potential which corresponds to the ultimate energy of the particles and $U_0$ is the potential of the particles at the inlet aperture electrode which corresponds to the initial energy of the particles.

Thus in a lithography system of the type according to the invention there is advantageously the possibility of enlarging or reducing the imaging of the mask structures on the substrate within certain limits by an alteration of the angle $\epsilon$. This is effected in a simple manner by increasing or decreasing the field intensity E of the electrostatic acceleration field. The amount of the enlargement or reduction of the mask structures depends on the one hand upon the alteration in the field intensity and on the other hand upon the distance between the mask and the substrate.

Figure 4:
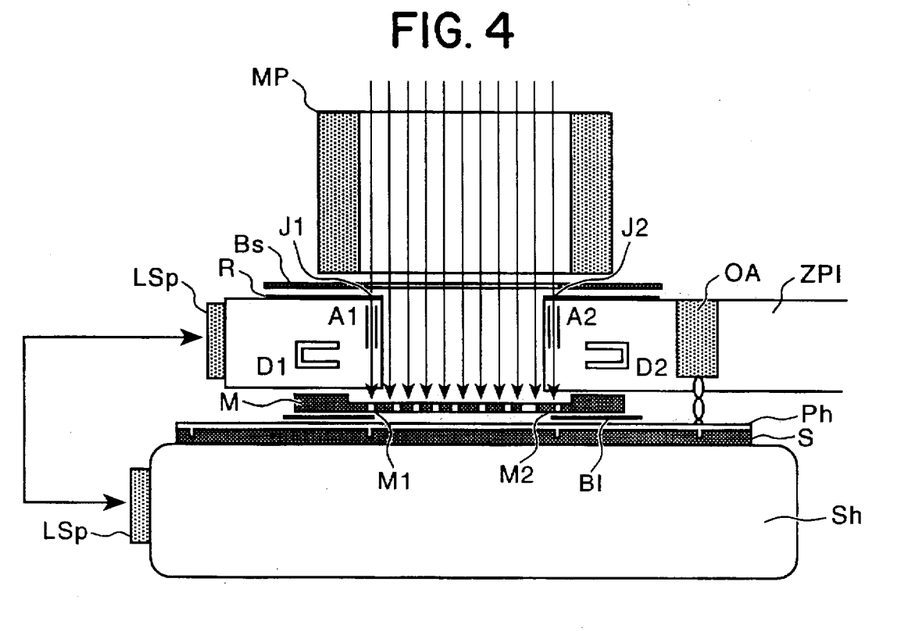
FIG. 4 shows a part of the arrangement of the type according to the invention which contains the mask, the substrate and various aids to adjustment.

A section of an operable lithography arrangement placed in the beam direction immediately before the substrate S is illustrated schematically in FIG. 4. This part lies substantially in its entirety within the homogeneous electrostatic field E produced by the electrode arrangement. In the present example this is a masked ion beam apparatus for lithographic purposes (MIBL) in which structures of a mask M are imaged by means of ions on a substrate S coated with a photoresist Ph. However, it is also possible to use this device for other purposes than lithography, e.g. for selective ion beam-induced epitaxy. There is also the possibility of using a device of this type for an electron beam masked beam device.

In the illustrated section there is shown an electrostatic multipole MP consisting of a plurality of sectors which is disposed coaxially about the particle beam and has for example 12 electrodes by means of which the particle beam can be tilted laterally or can be altered in cross-section, so that the imaging of the structures of the mask M on the substrate S can be displaced or compensated in any direction. A displacement of the particle beam in the X- or Y-direction is achieved by operating the multipole as a dipole. The extent of the displacement in the X- or Y-direction is substantially dependent upon the tilting of the beam (intensity of the dipole field) and upon the distance between the mask and the substrate. The width of the beam cross-section, on the other hand, can be influenced by operating the multipole as a quadrupole or a hexapole. If the multipole MP is operated as a quadrupole, the beam cross-section containing the image data can be altered from a square to a rectangle and vice versa. In operation as a hexapole a square beam cross-section is altered to a trapezoidal one and vice versa. The use of a multipole for these purposes is precisely described inter alia in a European Patent Application in the name of the present applicant with the publication No. EP-A-344 646.

It may further be seen from FIG. 4 that a reference plate R is provided in the beam path of the particle beam at a distance before the substrate S and the mask M, this reference plate having a central hole which limits the beam cross-section of the particle beam to a specific diameter, that is to say that a central part of the concentrated particle beam is allowed through to the mask M. In the reference plate R, directly on the edge of the central opening a plurality of smaller adjustment openings J1, J2 are cut out, through which adjustment beams are formed and allowed through in the direction of the mask M. For example two slots aligned perpendicular to one another in each case can be provided as adjustment openings—when viewed from above—at each corner of an imaginary square, that is to say a total of 8 adjustment openings J1, J2, ..., J8.

On both sides of each adjustment beam, immediately behind the adjustment openings J1, J2 of the reference plate R, deflecting plates A1, A2 are provided which are disposed in pairs on both sides of each adjustment beam. These deflecting plates A1, A2 serve to guide the adjustment beams of the particle beam with the aid of a suitable voltage signal, e.g. a sawtooth signal, over an associated marking M1, M2 of the mask M. In the case of eight adjustment openings, naturally, eight markings M1, M2, ..., M8 are provided. A marking M1, M2 can for example be a depression, a projection, a material overlay or an opening in the mask M, and in the case of an opening between the mask and the substrate an aperture B1 can be provided in order to prevent the adjustment beams from exposing the substrate. By scanning the adjustment beam across of the marking M1, M2 on the mask M a secondary signal, e.g. a secondary electron signal, is generated which can be detected by means of a detector D1, D2, e.g. a secondary electron detector. By comparison of the voltage signal applied to the deflecting plates A1, A2 with the secondary radiation signal picked up by the detector D1, D2 information can be obtained regarding the precise position of each marking M1, M2 on the masks M with regard to the associated adjustment opening J1, J2 of the reference plate R.

With the aid of for example 8 suitable adjustment openings J1, J2, ..., J8, the X-position, Y-position, a rotation, a difference in scale between the reference plate R and the mask M (also separately according to X- and Y-direction) and trapezoidal distortion of the mask M can be established. With a predetermined and measured position of the adjustment openings J1, J2, ..., J8 and the associated markings M1, M2, ..., M8 it is possible in particular to measure the direction of the ion beam onto the mask at the location of the markings. Thus the size of the shadow cast by the mask M onto the substrate S can be predetermined precisely.

With an arrangement of this type, by means of a feedback of the position measurement of the markings M1, M2, ... M8 with regard to the adjustment openings J1, J2, ... J8 as explained above to the voltage signals for the poles of the multipole MP, alterations in the relative position between the reference plate R and the mask M or alterations in the beam direction can be established immediately and can be corrected by way of a change in voltage on one or on several poles of the multipole MP. In particular such a correction can also take place during exposure of the substrate with the particle beam in order to image the structures of the mask on a constant location on the substrate. A continuous feedback of this type is known as a "Pattern Lock System" and is described in detail in connection with a device of a different construction, an ion beam projection lithography device (IPL) infer alia in the aforementioned European Patent Application in the name of the present applicant with the publication No. EP-A-344 646.

In the illustrated masked beam lithography arrangement there is also the possibility of providing behind the reference plate R a further reference plate (not shown) which can be introduced into the system instead of the mask. This further reference plate has, like the mask, markings which are coordinated with the adjustment openings and which serve to facilitate an adjustment of the ion beam without a mask having to be present in the system. In particular, the angle ε, that is to say the deviation of the ion beam direction from the z-direction, can be measured and optionally preset with the aid of the measures mentioned above.

The necessary alignment of the substrate S relative to the reference plate R or relative to the mask M is carried out in the illustrated embodiment by way of an optical alignment system OA. As is indicated in FIG. 4, the reference plate R and the optical alignment system OA are mounted on a plate ZPL (made for example from Zerodur because of the low coefficient of thermal expansion). The substrate S is located on a suitable substrate holder Sh which depending upon the measurement signal from the optical interference arrangement OA can be moved in two directions perpendicular to the beam direction and parallel to the beam direction or can be rotated about the beam direction.

The movement of the substrate holder Sh can be controlled by way of a laser interferometer which is indicated in FIG. 4 by a laser mirror LSp. Because of the available multipole, instead of a precise adjustment of the substrate position with the aid of a movement of the substrate holder Sh in the X- and Y- direction, it is possible advantageously by a lateral tilting of the particle beam to undertake the ion illumination of the mask structures at the desired substrate position. This tilting can be carried out with nanometre precision and rapidly milliseconds. Accordingly it is merely necessary to position the substrate within the working area of the multipole of several micrometers, which can be effected without problems with vacuum stage systems. After the stage movement has been carried out, with the aid of the laser interferometer the position of the substrate is measured precisely and the X-, Y-erroneous position is compensated by a multipole tilting of the masked ion beam. Equally, instead of a precise adjustment of the distance between the mask and the substrate in order to achieve the desired size of the shadow, an alteration in the scale in the masked ion beam can advantageously be achieved, as described above, by altering the field intensity of the electrode arrangement. By the choice of a basic setting with a somewhat larger angle ε it is possible to set not only an enlargement but also a reduction, which is necessary in particular when the dimensions of the substrate have altered in the course of the production process.

Between the reference plate R and the multipole MP a shutter Bs is provided by means of which the entire particle beam can be screened out, for example when the substrate is changed. By a particular geometric construction of this shutter Bs, e.g. by transverse slots, there is the possibility of allowing the adjustment beams through in the direction of the mask in any position of the shutter in order to be able to carry out adjustment measurements in any position of the shutter. However, this shutter could also be disposed between the mask and the substrate, in which case no special precautions are necessary for the adjustment beams.

Figure 5:
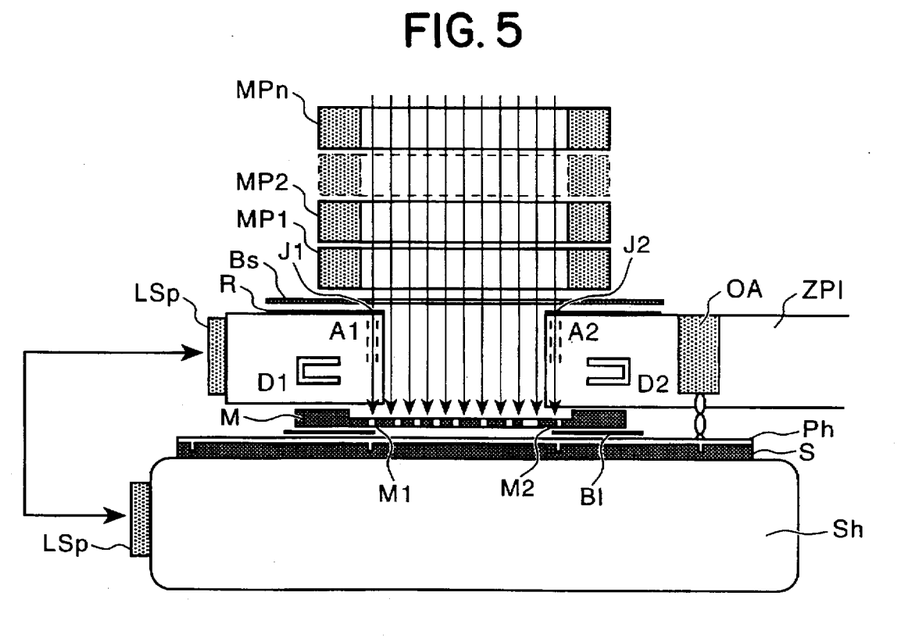
FIG. 5 shows a variant of the part of the arrangement shown in FIG. 4.

FIG. 5 shows the arrangement according to FIG. 4 in an embodiment which deals in a special way with the details of the homogeneous electrostatic field.

In this case the multipole MP is formed in the beam direction by a plurality of multipole rings $MP_1$, $MP_2$, ..., $MP_n$, of which each individual one is connected to the potential of the homogeneous electrostatic acceleration field E at the associated location of the space. The voltage signal from a specific pole of the multipole MP which is necessary for tilting of the particle beam is superimposed on the corresponding potential of the homogeneous electrostatic acceleration field E. If the electrode arrangement is formed by ring electrodes $El_1$, $El_2$, ..., $El_n$ as shown in FIG. 2, the multipole MP can be integrated directly into the electrode arrangement, wherein a group of ring electrodes, e.g. $El_5$, $El_6$, ..., $El_n$ disposed one after another in a group are divided into annular sectors, e.g. 12 sectors, which are electrically insulated from one another, so that these ring electrodes $El_5$, $El_6$, ..., $El_n$ divided into sectors simultaneously form the rings $MP_1$, $MP_2$, ..., $MP_n$ of the multipole MP. If the electrode arrangement is formed by longitudinal bars, each pole of the multipole can for example be formed by a longitudinal bar or several of these bars can be combined to form one pole of the multipole. With such a variant it is advantageous to produce the electrode arrangement from two series of longitudinal bars disposed one after the other, of which the bars facing the mask are used to form the multipole. Also in the case where the electrode arrangement is constructed for generation of the homogeneous acceleration field constructed in the form of a hollow cylinder, the multipole can optionally be integrated into the electrode arrangement. In this case corresponding sectors of the cylinder wall are insulated from one another and supplied with the voltage signals for the multipole in addition to the potential for the acceleration field.

Likewise, the reference plate is connected to the corresponding potential of the electrostatic acceleration field in order as far as possible to avoid inhomogeneities of the acceleration field. Since the deflecting plates A1, A2 are disposed in the region of the homogeneous electrostatic field, these are preferably also made up in the beam direction of a plurality of portions disposed one after the other which again are connected to the predetermined potential of the homogeneous electrostatic field E at the relevant locations. The voltage signal (sawtooth voltage) is superimposed on these electrostatic potentials in known manner. In order further to reduce a disturbance of the homogeneous electrostatic field, the operating voltage of the secondary beam detectors D1, D2 can also be adapted to the associated potential of the electrostatic acceleration field E.

As has already been stated above, it is possible to provide coaxially about the beam a cooled surface (not shown) which takes up at least a portion of the radiant heat resulting from the irradiation of the reference plate R and the mask M, so that the mask M is kept heat-stable. This cooled surface can be constructed as a thermally or electrically conductive hollow cylinder which is electrically insulated from the electrode arrangement and surrounds the latter. With suitable shaping of the electrode arrangement the latter can itself be cooled and serve for radiant cooling of the mask. If the electrode arrangement for the homogeneous acceleration field is constructed in the form of a hollow cylinder, this function can be fulfilled by the inner surface of the hollow cylinder.

At this point it should also be noted that it is not necessary in all cases for the homogeneous electrostatic acceleration field to extend directly as far as the substrate and for the substrate and the mask to be integrated into the acceleration field. If the acceleration field merely extends as far as the mask, however, the potential lines of the acceleration field can project through the mask openings, so that at each mask opening an electrostatic mini-lens is formed which influences the masked beam imaging. The effect referred to is known as "Flies Eyes Effect". By these so-called mini-lenses, for example, a refocussing of the particle beam between the mask and the substrate can take place. Such a procedure is described in the article "Characteristics and Applications of Multiple Beam Machines" by Julius J. Murray, SRI International, in Microelectronic Engineering 9 (1989), 305 ff. In an arrangement according to the invention this so-called Flies Eyes Effect only appears extremely faintly because of the small distance between the mask and the substrate and the low field intensity, so that practically no impairment of the imaging properties is to be expected. If the mask and the substrate are integrated into the homogeneous acceleration field as described in the embodiments according to FIGS. 2 and 3, this effect does not appear at all.

The embodiments of a lithography system according to the invention which have already been described in detail above and illustrated in FIGS. 2 and 3 are set out below with reference to characteristic data of practical relevance, the starting point being an ion source for singly charged ions and the diameter of the virtual ion source being approximately 10 μm. For the brilliance of a currently achievable ion source a value of $10^4$ Ampere/$cm^2$.sterad is assumed. The brilliance of an ion source has essentially no influence on the quality of the imaging, but merely determines the exposure time of the substrate, e.g. for lithographic purposes. For the exposure of a suitable photoresist with a sensitivity of 0.3 μC/$cm^2$, in the case of an image field with a diameter of approximately 200 mm an exposure time of the order of magnitude of approximately 1 sec. may be expected. With this a significant productivity can be achieved using such an arrangement.

TABLE 1

(Embodiment according to FIG. 2)

| Type | homogeneous field E | | | |
|---|---|---|---|---|
| total length[1] | 2 m | | | |
| diameter[2] | 0.6 m | | | |
| image field[3] | ⌀ 200 mm | | | |
| extraction energy | 10 keV | | | |
| accelerating voltage | 80 kV | | | |
| length of the hom. field E | 2 m | | | |
| field intensity of the hom. field E | 40 kV/m | | | |
| ion energy on the mask | 90 keV | | | |
| energy distribution of the ion source | ±1 eV | | ±3 eV | |
| geom. aberration of imaging[4] | 5.0 μrad | | 5.0 μrad | |
| chrom. aberration of imaging[5] | 1.1 μrad | | 3.3 μrad | |
| total aberration θ[6] | 5.1 μrad | | 6.0 μrad | |
| mask substrate distance | 1 mm | 1 cm | 1 mm | 1 cm |

TABLE 1-continued (Embodiment according to FIG. 2)

| | | | | |
|---|---|---|---|---|
| resolution[7] | 5.1 nm | 51 nm | 6 nm | 60 nm |
| distortion[8] | 0 nm | 0 nm | 0 nm | 0 nm |

| | |
|---|---|
| inhomogeneity of illumination | 0% |
| type of illumination | divergent |
| divergence of marginal beam $\epsilon^9$ ($\emptyset$ = 200 mm) | 33 mrad |
| sensitivity to unevenness of the substrate[10] | 33 nm/μm |

TABLE 2

(Embodiment according to FIG. 3)

| Type | field-free space + homogeneous field E | | | |
|---|---|---|---|---|
| total length[1] | 2 m | | | |
| diameter[2] | 1.6 m | | | |
| image field[3] | ⌀ 200 mm | | | |
| extraction energy | 10 keV | | | |
| accelerating voltage | 60 kV | | | |
| length of the hom. field E | 1 m | | | |
| field intensity of the hom. field E | 60 kV/m | | | |
| ion energy on the mask | 70 keV | | | |
| energy distribution of the ion source | ±1 eV | | ±3 eV | |
| geom. aberration of imaging[4] | 10 μrad | | 10 μrad | |
| chrom. aberration of imaging[5] | 10 μrad | | 30 μrad | |
| total aberration $\theta^6$ | 14 μrad | | 32 μrad | |
| mask substrate distance | 1 mm | 1 cm | 1 mm | 1 cm |
| resolution[7] | 14 nm | 140 nm | 32 nm | 320 nm |
| distortion[8] | 300 nm | 3000 nm | 300 nm | 3000 nm |
| inhomogeneity of illumination | 2% | | | |
| type of illumination | approximately parallel | | | |
| divergence of marginal beam $\epsilon^9$ ($\emptyset$ = 200 mm) | 0.3 mrad | | | |
| sensitivity to unevenness of the substrate[10] | 0.3 nm/μm (not very sensitive) | | | |

Within the scope of the invention the characteristic data set out in the above tables should be understood as follows:

1 "Total length" states the distance of the image point Q' from the mask M or the substrate S in the sense of FIGS. 2 and 3.

2 The "diameter" states the external diameter of the electrode arrangement.

3 The data for the "image field" corresponds to the beam diameter at the location of the mask.

4 The "geometric aberration of imaging" should be understood to mean any aberration which is caused by the finite size of the particle source (here 10 μm). The maximum angle of all rays emanating from a mask point is stated.

5 The "chromatic aberration of imaging" is any aberration which results from the unsharpness of energy (here ±1 or ±3 eV). The maximum angle of all rays emanating from a mask point is stated.

6 The "total aberration $\Theta$" is calculated by quadratic addition of the geometric and chromatic aberration:

$$\Theta = \sqrt{(\text{geom. aberration})^2 + (\text{chrom. aberration})^2} \quad .$$

7 The "resolution" of the imaging is produced from the total aberration and the distance between the mask and the substrate (here 1 mm or 1 cm).

8 The parameter "distortion" states the maximum deviation of an image point from the desired position which results from the lens aberrations of 3rd and higher order of the electrode arrangement, in particular the aperture electrode B'. In the case of a beam generation by a pure acceleration field (FIG. 2) this aberration is substantially equal to zero.

9 The "divergence of the marginal beam $\epsilon$" should be understood to be the deviation of the outermost part the particle beam from the central beam direction, that is to say the deviation from the parallel. The angle of the divergence at a diameter of 200 mm is stated (cf. FIG. 1). This divergence does not result in any imaging aberrations, since it can be taken into consideration during the production and positioning of the mask or by the field intensity.

The "sensitivity to unevenness of the substrate" denotes those imaging aberrations which can result from deviations of the distance between the mask and the substrate from the predetermined value (1 mm or 1 cm). This aberration is produced from the divergence $\epsilon$ of the marginal beam and can be caused by unevenness of the substrate or of the mask.

We claim:

1. Arrangement for masked beam lithography by means of electrically charged particles for the imaging of structures of a mask on a substrate arranged behind it, with a substantially punctiform particle source and an extraction system for a specific type of charged particles which leave the source in the form of a divergent particle beam, and with a means for concentrating the divergent particle beam into a particle beam which is at least approximately parallel for irradiation of the mask or of the substrate, wherein the means for concentrating the particle beam has an electrode arrangement for generating an electrostatic acceleration field, the potential of which in the beam direction has a constant gradient at least in parts and perpendicular to the beam direction is substantially constant at least within the beam cross-section.

2. Arrangement according to claim 1, wherein the electrode arrangement for generating the electrostatic field has a plurality of coaxial ring electrodes which are disposed at intervals behind one another in the beam direction and are connected to different potentials in such a way that a homogeneous acceleration field is formed in the beam direction within the beam cross-section.

3. Arrangement according to claim 1, wherein the electrode arrangement for generating the electrostatic field has a coaxial hollow cylinder which is aligned in the beam direction and has a predetermined electrical resistance per unit of length, the end surfaces of the hollow cylinder being connected to predetermined electric potentials.

4. Arrangement according to claim 3, wherein the hollow cylinder is formed by a grating.

5. Arrangement according to claim 1, wherein the electrode arrangement for generating the electrostatic field has a plurality of longitudinal bars which are aligned in the beam direction, disposed in parallel on the surface of an imaginary coaxial cylinder about the longitudinal axis of the beam and has a constant resistance per unit of length, the end surfaces of the longitudinal bars each being connected to a predetermined electric potential.

6. Arrangement according to claim 1, wherein the punctiform particle source is an ion source with a virtual source point, which optionally has an extraction system for ions of a specific energy and a separation means for separating off ions of a desired type.

7. Arrangement according to claim 1, wherein there is provided in the beam path between the source and the electrode arrangement at least one electrostatic convergent lens which focuses the divergent particle beam coming from the punctiform source into an image of the source which lies in or before the starting potential plane of the electrode arrangement.

8. Arrangement according to claim 1, wherein the internal diameter of the electrode arrangement is at least twice as great as the greatest diameter of the particle beam.

9. Arrangement according to claim 1, wherein the mask is disposed immediately before the substrate in the beam direction and the distance between the mask and the substrate is between 10 μm and 1 cm.

10. Arrangement according to claim 1, wherein the electrode arrangement has an inlet aperture electrode, the aperture of which contains the source point or the image of the punctiform source and is not substantially larger than the diameter of the virtual source or of the image of the source, the aperture electrode being connected to a potential which corresponds to the energy of the charged particles in the source or at the image point, and in the beam direction the homogeneous electrostatic acceleration field directly adjoins this aperture electrode.

11. Arrangement according to claim 1, wherein the electrode arrangement has a aperture electrode which is disposed in the beam direction at a distance from the source or from the image of the source, the aperture electrode being connected to a potential which substantially corresponds to the energy of the charged particles in the source or at the image point, and the homogeneous electrostatic acceleration field immediately adjoins this aperture electrode.

12. Arrangement according to claim 1, wherein the electrostatic field extends in the beam direction as far as the substrate.

13. Arrangement according to claim 12, wherein the substrate is a terminal electrode of the electrode arrangement which is connected to the potential of the electrostatic field at this location.

14. Arrangement according to one of claims 12 or 13, wherein the mask is an electrode of the electrode arrangement which is connected to the potential of the electrostatic field at this location.

15. Arrangement according to claim 1, wherein the means for concentrating the particle beam also have a means for tilting the particle beam perpendicular to the beam direction and a means for altering the beam cross-section, which are disposed in the region of the electrostatic field and connected to a potential which corresponds to the potential of the electrostatic field at this location.

16. Arrangement according to claim 15, wherein the means for tilting the particle beam is a multipole which is operated as a dipole and is disposed coaxially about the axis of the particle beam, and which in the beam direction is formed by a plurality of portions disposed one after the other of which each as base potential is connected to the potential of the electrostatic acceleration field at the relevant location, the potentials for generating a dipole field being added to this base potential.

17. Arrangement according to claim 15, wherein the means for altering the beam cross-section is a multipole which is operated as a quadrupole or as a hexapole and is disposed coaxially about the axis of the particle beam and which in the beam direction is formed by a plurality of portions disposed one after the other of which each as base potential is connected to the potential of the electrostatic acceleration field at the relevant location, the potentials for generating a quadrupole or hexapole field being added to this base potential.

18. Arrangement according to one of claims 15 to 17, wherein the means for displacing the particle beam or the means for altering the beam cross-section is integrated into the electrode arrangement for generating the homogeneous acceleration field, this electrode arrangement being divided into a plurality of sectors which each form a pole of the multipole.

19. Arrangement according to claim 1, wherein an alignment system is provided in the beam path at a distance before the substrate and the mask and has a reference plate which has a central hole through which a central part of the concentrated particle beam is allowed through to the mask or to the substrate, the reference plate having on the edge of the central hole a plurality of smaller adjustment openings through which adjustment beams are formed in the region of the partially screened-out particle beam and allowed through in the direction of the mask (M).

20. Arrangement according to claim 19, wherein immediately behind the adjustment openings of the reference plate, deflecting plates are provided which are disposed in pairs on both sides of each adjustment beam and by which each adjustment beam can be guided with the aid of a voltage signal over an associated marking of the mask, means being provided for comparing a measurement signal emanating from the marking of the mask with the voltage signal from the deflecting plates in order to determine the position of the mask relative to the reference plate.

21. Arrangement according to claim 20, wherein the deflecting plates are disposed in the region of the electrostatic field and have in the beam direction a plurality of portions disposed one after the other which are connected to the potential of the electrostatic field at the relevant locations.

22. Arrangement according to claim 20 or 21, wherein behind the reference plate there is provided a further reference plate by means of which instead of the mask an alignment of the beam can be carried out, this further reference plate being connected to the potential of the electrostatic acceleration field at the relevant location.

23. Arrangement according to one of claims 19 to 21, wherein the reference plate can be aligned with the substrate or to a substrate carrier by way of an optical system.

24. Arrangement according to claim 1, wherein the field intensity of the homogeneous acceleration field can be varied within predetermined limits, so that the deviation of the particle beam from the parallelism in the region of the substrate is altered and the structures of the mask are imaged more or less enlarged or reduced on the substrate.

25. Arrangement according to claim 1, wherein the potential difference between the terminal electrodes of the electrode arrangement for generating the homogeneous electrostatic field is between 25 and 200 kV.

26. Arrangement according to claim 25, wherein the energy of particles with a single positive or negative unit charge particles on entry into the homogeneous acceleration field is between 2 and 20 keV.

27. Arrangement according to claim 26, wherein the field intensity of the homogeneous electrostatic field is between 25 and 180 kV/m.

28. Arrangement according to claim 1, wherein the diameter of the concentrated particle beam directly before the substrate is between 20 and 300 mm.

29. An apparatus for accelerating a particle beam along a beam path, comprising:

an electrode arrangement that receives said particle beam and is adapted to concentrate it so that charged particles in said particle beam are guided on substantially parallel paths with respect to a beam direction of said beam path, said electrode arrangement generating an electrostatic acceleration field having a constant gradient potential in said beam direction and having a substantially constant potential in a direction perpendicular to said beam path at least within a cross-section of said particle beam.

30. The apparatus according to claim 29, further comprising:

a particle source that generates said particle beam from a substantially punctiform virtual source point; and a lens that images said particle beam from said particle source and converges it to an image point, said particle beam in said beam direction being divergent from said image point.

31. The apparatus according to claim 30, wherein said electrode arrangement includes:

an aperture electrode provided at said image point, said aperture electrode being connected to a first potential that corresponds to the energy of charged particles in said particle beam at said virtual source point, said aperture electrode having an aperture that corresponds to a diameter of said particle beam at said image point; and a plurality of coaxial ring electrodes which are disposed at intervals behind one another and said aperture electrode in the beam direction and which are connected to different potentials in such a way that a homogeneous acceleration field is formed in said beam direction within said cross section of said particle beam.

32. The apparatus according to claim 30, wherein said electrode arrangement includes a coaxial hollow cylinder which is aligned in said beam direction and has a predetermined electrical resistance per unit of length, the opposite ends of said hollow cylinder being connected to predetermined first and second electric potentials, respectively.

33. The apparatus according to claim 30, wherein said electrode arrangement includes a plurality of longitudinal bars which are aligned in said beam direction, disposed in parallel on the surface of an imaginary coaxial cylinder about said beam path and having a constant resistance per unit of length, the opposite end surfaces of said longitudinal bars each being connected to predetermined electric potentials, respectively.

34. The apparatus according to claim 29, wherein an internal diameter of said electrode arrangement is at least twice as great as a maximum diameter of said particle beam.

35. The apparatus according to claim 29, further comprising:

a mask for imaging structures on a substrate arranged behind it, said mask being provided behind said electrode arrangement in said beam direction.

36. The apparatus according to claim 35, wherein said mask is connected to a mask potential so that said electrostatic acceleration field is continuously homogeneous between said electrode arrangement and said substrate.

37. The apparatus according to claim 35, wherein a field intensity of said electrostatic acceleration field can be varied within predetermined limits, so that a deviation of said particle beam from parallel with respect to said beam direction in the region of said substrate is altered and said structures of said mask imaged on said substrate are more or less enlarged or reduced.

38. The apparatus according to claim 30, wherein said electrode arrangement includes:

an aperture electrode provided at a distance in said beam direction from said image point, said aperture electrode being connected to a first potential that corresponds to the energy of charged particles in said particle beam at said virtual source point, said aperture electrode having an aperture that corresponds to a diameter of said particle beam at said image point; and a plurality of coaxial ring electrodes which are disposed at intervals behind one another and said aperture electrode in the beam direction and which are connected to different potentials in such a way that a homogeneous acceleration field is formed in said beam direction within said cross section of said particle beam.

39. The apparatus according to claim 29, further comprising a multipole that is operative to tilt the particle beam and to alter said cross section of said particle beam, said multipole being integrated into said electrode arrangement, said electrode arrangement being divided into a plurality of sectors which each form a pole of the multipole.

40. An apparatus for masked beam lithography, comprising:

a particle source that generates a particle beam from a substantially punctiform virtual source point; and a lens that images said particle beam from said particle source and converges it to an image point, said particle beam being divergent from said image point with respect to a beam direction of said beam path;

an electrode arrangement arranged after said lens in said beam path that receives said particle beam and is adapted to concentrate it so that charged particles in said particle beam are guided on substantially parallel paths with respect to said beam direction of said beam path, said electrode arrangement generating an electrostatic acceleration field having a constant gradient potential in said beam direction and having a substantially constant potential in a direction perpendicular to said beam path at least within a cross-section of said particle beam, said electrode arrangement including:

an aperture electrode provided at said image point, said aperture electrode being connected to a first potential that corresponds to the energy of charged particles in said particle beam at said virtual source point, said aperture electrode having an aperture that corresponds to a diameter of said particle beam at said image point, and a plurality of coaxial ring electrodes which are disposed at intervals behind one another and said aperture electrode in the beam direction and which are connected to different potentials in such a way that a homogeneous acceleration field is formed in said beam direction within said cross section of said particle beam; and a mask for imaging structures on a substrate arranged behind it, said mask being provided behind said electrode arrangement in said beam direction, said mask being connected to a mask potential so that said electrostatic acceleration field is continuously homogeneous between said electrode arrangement and said substrate.

\* \* \* \* \*